(12) United States Patent
Kuttner

(10) Patent No.: US 7,474,243 B1
(45) Date of Patent: Jan. 6, 2009

(54) SEMICONDUCTOR DEVICE INCLUDING SWITCH THAT CONDUCTS BASED ON LATCHED BIT AND NEXT BIT

(75) Inventor: Franz Kuttner, St. Ulrich (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/854,849

(22) Filed: Sep. 13, 2007

(51) Int. Cl.
 *H03M 1/66* (2006.01)
(52) U.S. Cl. ............................. 341/144; 341/136
(58) Field of Classification Search ........... 341/136, 341/144
 See application file for complete search history.

(56) References Cited

U.S. PATENT DOCUMENTS

| | | | |
|---|---|---|---|
| 4,910,514 A * | 3/1990 | Irmer et al. ............ 341/64 |
| 5,164,725 A | 11/1992 | Long | |
| 5,272,432 A | 12/1993 | Nguyen et al. | |
| 5,489,902 A | 2/1996 | Shyu et al. | |
| 5,625,360 A | 4/1997 | Garrity et al. | |
| 5,689,257 A * | 11/1997 | Mercer et al. ........ 341/133 |
| 5,933,107 A * | 8/1999 | Tan .................. 341/144 |
| 6,160,507 A * | 12/2000 | Carbou et al. ........ 341/144 |
| 6,331,830 B1 | 12/2001 | Song et al. | |
| 6,344,816 B1 * | 2/2002 | Dedic ................ 341/144 |
| 6,501,402 B2 | 12/2002 | Boxho | |
| 6,664,906 B2 * | 12/2003 | Volk ................ 341/118 |
| 6,778,115 B2 | 8/2004 | Eloranta | |
| 7,068,201 B1 | 6/2006 | Chou | |
| 7,081,844 B1 | 7/2006 | Huang et al. | |
| 2006/0125670 A1 | 6/2006 | Cho et al. | |

\* cited by examiner

*Primary Examiner*—Khai M Nguyen
(74) *Attorney, Agent, or Firm*—Dicke, Billig & Czaja, PLLC

(57) ABSTRACT

A semiconductor device is disclosed. In one embodiment, the semiconductor device includes a first switch, a second switch, and a third switch. The first switch is configured to latch a bit in a series of bits to provide a latched bit. The second switch is configured to conduct based on the latched bit. The third switch is configured to conduct based on the latched bit and a next bit in the series of bits. The next bit follows the latched bit in the series of bits.

25 Claims, 4 Drawing Sheets

| | 200 SEL | 202 LSEL | 204 IOUT | 206 PRE-CHARGE |
|---|---|---|---|---|
| 208 | 0 | 0 | 0 | 0 |
| 210 | 0 | 1 | 1 | 0 |
| 212 | 1 | 0 | 0 | 1 |
| 214 | 1 | 1 | 1 | 0 |

SEMICONDUCTOR DEVICE INCLUDING SWITCH THAT CONDUCTS BASED ON LATCHED BIT AND NEXT BIT

BACKGROUND

Often, semiconductor devices include data converters, such as analog-to-digital converters (ADCs) and digital-to-analog converters (DACs). The data converters are used in applications that include digital signal processing of real-world signals, such as applications in audio processing, video processing, instrumentation, and communication systems. Applications include mobile phones, base stations, cordless networks, imaging systems, test equipment, and radio frequency (RF) transceivers. Each of the semiconductor devices can be a single integrated circuit chip or multiple integrated circuit chips.

An ADC converts an input analog signal to an output digital signal, where the value of the output digital signal corresponds to the amplitude of the input analog signal. The output digital signal can be a series of digital code words or a serial bit string.

A DAC converts an input digital signal to a corresponding output analog signal. Usually, digital codes are converted to analog signals by assigning a voltage or current weight to each bit in the digital code and summing the weights of the digital code.

Typically, a DAC includes a decoder, a number of analog output elements, and a summing circuit. The decoder receives an input digital code and provides selection signals to selectively activate the analog output elements. In response to the selection signals, selected analog output elements provide analog signals that are combined by the summing circuit to produce the analog output, which is an analog representation of the input digital code. The analog output elements can be unity coded or weighted. In a DAC including unity coded analog output elements, such as a thermometer-coded DAC, each of the selected analog output elements provides the same amount of voltage or current. In a binary-weighted DAC, the analog output elements provide amounts that are weighted by the power of two. Sometimes a DAC is segmented to include a thermometer-coded portion and a binary-weighted portion.

Often, in a current-steering DAC the analog output elements are current cells, where each current cell includes a differential switch and a current source. The differential switch is controlled to steer current from the current source to the output of the current cell or to another node, such as ground, based on the input digital code. The outputs of the current cells are combined to yield a total current that is proportional to the number of switched-on current cells. The total current can be transformed into a voltage via resistors and amplifiers. In a current-steering DAC, the current sources are never shut off and power is continuously consumed by each of the current cells.

In a DAC including current cells that have a single-ended switch and a current source, the switch is controlled to provide the current to the output of the current cell or to shut off the current based on the input digital code. This reduces power consumption. However, if switches are not turned on and off simultaneously, current sources in different current cells can short together and parasitic capacitances can be discharged. Each of these events leads to glitches in the analog output and poorer performance.

For these and other reasons there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 4 is a logic table illustrating the operation of the current cell of FIG. 3.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
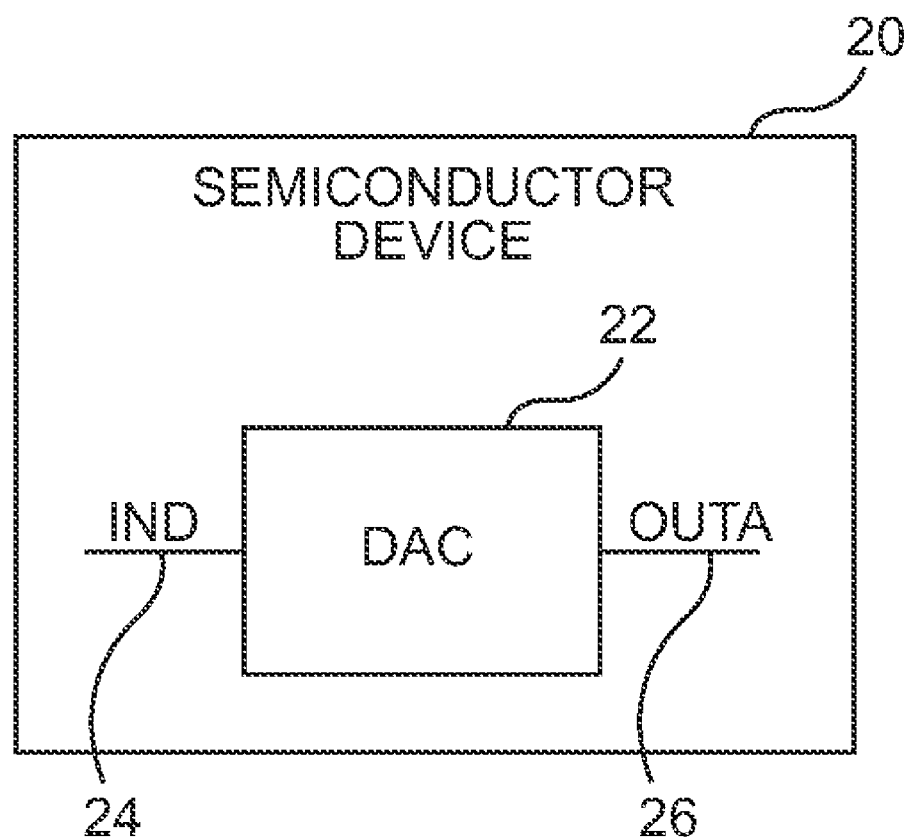
FIG. 1 is a diagram illustrating one embodiment of a semiconductor device according to the present invention.

FIG. 1 is a diagram illustrating one embodiment of a semiconductor device 20 according to the present invention. Semiconductor device 20 includes a DAC 22 that receives a series of input digital codes IND at 24 and provides a corresponding output analog signal OUTA at 26. In one embodiment, semiconductor device 20 is a single integrated circuit chip. In one embodiment, semiconductor device 20 includes multiple integrated circuit chips.

Semiconductor device 20 can be in any suitable application, such as audio processing, video processing, instrumentation, and communications. In one embodiment, semiconductor device 20 is in an RF transceiver. In one embodiment, semiconductor device 20 is in a mobile phone. In one embodiment, semiconductor device 20 is in a base station. In one embodiment, semiconductor device 20 is in a cordless network. In one embodiment, semiconductor device 20 is in an imaging system. In one embodiment, semiconductor device 20 is in test equipment.

DAC 22 decodes the digital codes in the series of input digital codes IND at 24 and provides selection signals that select analog output elements based on the decoded digital codes. Selected analog output elements provide analog signals that are combined to produce the output analog signal OUTA at 26. Non-selected analog output elements do not provide analog signals that are combined to produce the analog signal OUTA at 26. In one embodiment, each of the analog output elements decodes the selection signals and provides a series of selection bits that are sequentially latched in the analog output element.

Each of the analog output elements includes a single-ended switch that is controlled to provide an analog signal at the output of the analog output element or to shut off the analog signal based on the selection signals. Also, each of the analog output elements includes a switch that is controlled to pre-charge non-selected analog output elements that are to be selected via the next digital code in the series of input digital codes IND at 24. Controlling the analog signal via single-ended switches reduces power consumption and pre-charging non-selected analog output elements that are to be selected with the next digital code in the series of input digital codes IND at 24 reduces glitches in the analog output and improves performance.

In one embodiment, the analog output elements are current cells. Each of the current cells includes logic that decodes selection signals and provides a series of selection bits. Each of the current cells includes a first switch that latches in selection bits and a second switch that conducts current between a node and the output of the current cell based on the latched selection bit. In selected current cells the second switch conducts current and in non-selected current cells the second switch is non-conducting. Each current cell includes a third switch that conducts to pre-charge the node in non-selected current cells if the next digital code in the series of input digital codes IND at 24 selects the current cell.

In one embodiment, DAC 22 includes analog output elements that are unity coded. In one embodiment, DAC 22 includes analog output elements that are binary-weighted. In one embodiment, DAC 22 is a thermometer coded DAC. In one embodiment, DAC 22 is a binary-weighted DAC. In one embodiment, DAC 22 is segmented. In one embodiment, DAC 22 includes a thermometer-coded DAC section and a binary-weighted DAC section.

Figure 2:
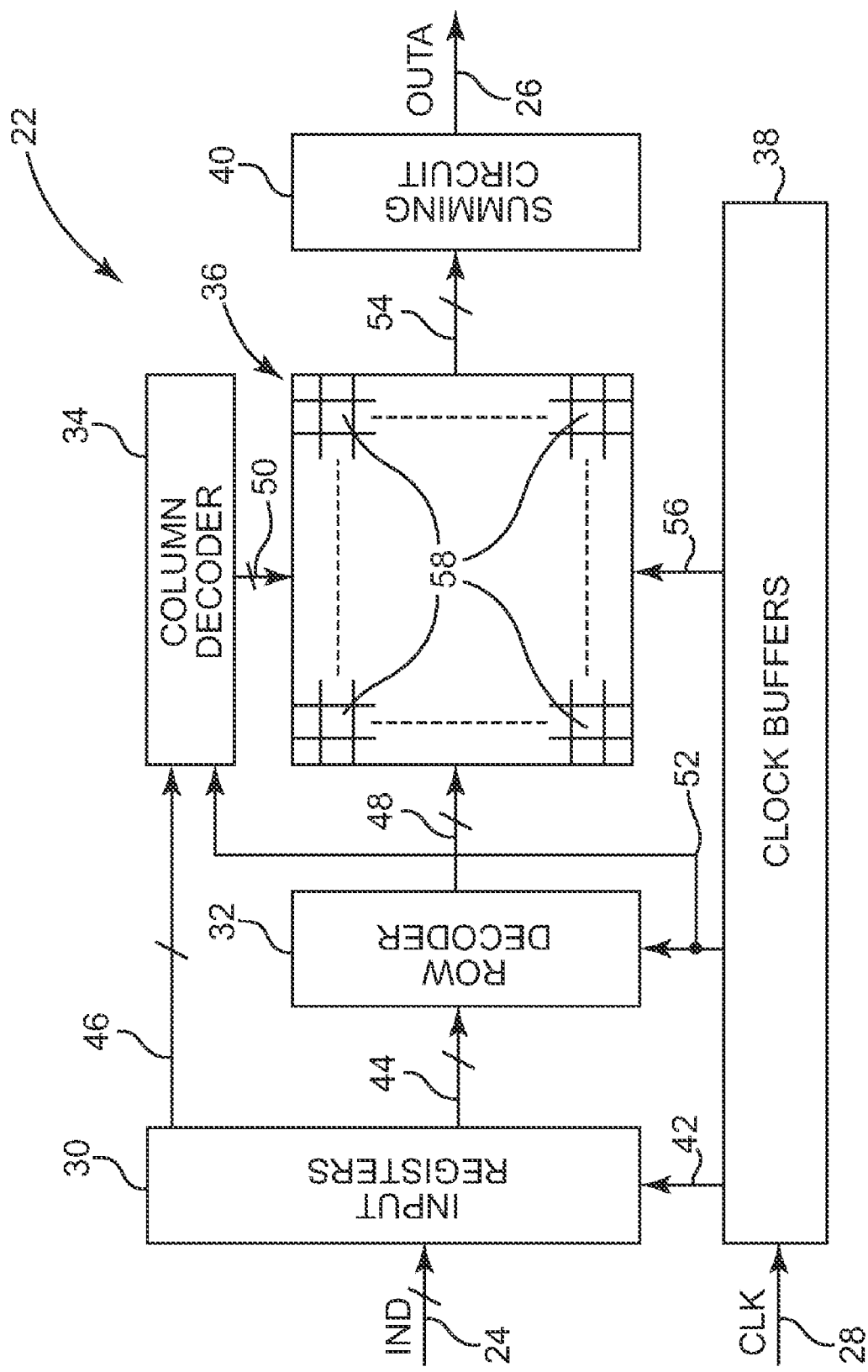
FIG. 2 is a block diagram illustrating one embodiment of a DAC.

FIG. 2 is a block diagram illustrating one embodiment of DAC 22 that receives a clock signal CLK at 28 and the series of input digital codes IND at 24 and provides the output analog signal OUTA at 26. DAC 22 can be in any suitable application, such as audio processing, video processing, instrumentation, and communications. In one embodiment, DAC 22 is in an RF transceiver. In one embodiment, DAC 22 is in a mobile phone. In one embodiment, DAC 22 is in a base station. In one embodiment, DAC 22 is in a cordless network. In one embodiment, DAC 22 is in an imaging system. In one embodiment, DAC 22 is in test equipment.

DAC 22 includes input registers 30, a row decoder 32, a column decoder 34, an array of analog output elements 36, clock buffers 38, and a summing circuit 40. Input registers 30 are electrically coupled to one or more clock buffers 38 via input register clock signal paths 42. Input registers 30 are electrically coupled to row decoder 32 via row signal paths 44 and to column decoder 34 via column signal paths 46. Input register clock signal paths 42 include any suitable number of signal lines, row signal paths 44 include any suitable number of signal lines, and column signal paths 46 include any suitable number of signal lines. In one embodiment, input register clock signal paths 42 include 1 signal line. In one embodiment, row signal paths 44 include 4 signal lines. In one embodiment, column signal paths 46 include 4 signal lines.

Clock buffers 38 receive clock signal CLK at 28 and provide buffered clock signals to input registers 30 via input register clock signal paths 42. Input registers 30 receive the buffered clock signals and the series of input digital codes IND at 24. Input registers 30, clock in and store each of the digital codes in the series of digital codes IND at 24 via the buffered clock signals. Each of the digital codes in the series of input digital codes IND at 24 is a parallel word, i.e., a number of parallel bits. Some of the bits of each of the digital codes are provided to row decoder 32 via row signal paths 44 and some of the bits of each of the digital codes are provided to column decoder 34 via column signal paths 46. In one embodiment, each of the digital codes is 8 parallel bits, where 4 of the bits are provided to row decoder 32 and the other 4 bits are provided to column decoder 34.

Row decoder 32 and column decoder 34 are electrically coupled to one or more clock buffers 38 via decoder clock signal paths 52. Clock buffers 38 receive clock signal CLK at 28 and provide buffered clock signals to row decoder 32 and column decoder 34 via decoder clock signal paths 52. Row decoder 32 is electrically coupled to the array of analog output elements 36 via line select paths 48 and column decoder 34 is electrically coupled to the array of analog output elements 36 via column select paths 50. Line select paths 48 include any suitable number of signal lines, column select paths 50 include any suitable number of signal lines, and decoder clock signal paths 52 include any suitable number of signal lines. In one embodiment, line select paths 48 include 16 signal lines. In one embodiment, column select paths 50 include 16 signal lines. In one embodiment, decoder clock signal paths 52 include 1 signal line.

Row decoder 32 receives some of the bits of each digital code via row signal paths 44 and buffered clock signals via decoder clock signal paths 52. Row decoder 32 decodes the received bits and provides line selection signals to the array of analog output elements 36 via the buffered clock signals and line select paths 48.

Column decoder 34 receives some of the bits of each digital code via column signal paths 46 and buffered clock signals via decoder clock signal paths 52. Column decoder 34 decodes the received bits and provides column selection signals to the array of analog output elements 36 via the buffered clock signals and column select paths 50.

The array of analog output elements 36 is electrically coupled to summing circuit 38 via element output paths 54 and to one or more of the clock buffers 38 via array clock signal paths 56. Clock buffers 38 receive clock signal CLK at 28 and provide buffered clock signals to the array of analog output elements via array clock signal paths 56. Element output paths 54 include any suitable number of signal lines and array clock signal paths 56 include any suitable number of signal lines.

The array of analog output elements 36 includes a number of analog output elements 58 that are electrically coupled to row decoder 32 via line select paths 48, column decoder 34 via column select paths 50, one or more clock buffers 38 via array clock signal paths 56, and summing circuit 38 via element output paths 54. In one embodiment, the array of analog output elements 36 includes 256 analog output elements 58.

Analog output elements 58 receive line selection signals via line select paths 48, column selection signals via column select paths 50, and buffered clock signals via array clock signal paths 56. Analog output elements 58 are selected based on the row selection signals and column selection signals. Selected analog output elements 58 provide analog signals that are provided to summing circuit 40 via element output paths 54. Summing circuit 40 combines the received analog signals to produce the output analog signal OUTA at 26. Non-selected analog output elements 58 do not provide analog signals to summing circuit 40.

In one embodiment, each of the analog output elements 58 includes a single-ended switch that is controlled to provide the analog signal at the output of the analog output element 58 or to shut off the analog signal based on the row selection signals and the column selection signals. Also, each of the analog output elements 58 includes a switch that is controlled to pre-charge non-selected analog output elements 58 that are to be selected via the next digital code in the series of input digital codes IND at 24.

In one embodiment, analog output elements 58 are current cells. Each of the current cells includes logic that decodes row selection signals and column selection signals to provide a series of selection bits. Each of the current cells includes a first switch that latches in selection bits and a second switch that conducts current between a node and the output of the current cell based on the latched selection bit. In selected current cells the second switch conducts current and in non-selected current cells the second switch is non-conducting. Each current cell includes a third switch that conducts to pre-charge the node in non-selected current cells if the next digital code in the series of input digital codes IND at 24 selects the current cell.

In operation, clock buffers 38 receive clock signal CLK at 28 and provide buffered clock signals to input registers 30 via input register clock signal paths 42, to row decoder 32 and column decoder 34 via decoder clock signal paths 52, and to analog output elements 58 via array clock signal paths 56. Input registers 30 receive the buffered clock signals and clock in one of the digital codes in the series of digital codes IND at 24. Input registers 30 provide some of the bits of the stored digital code to row decoder 32 and some of the bits of the stored digital code to column decoder 34.

Row decoder 32 receives some of the bits of the stored digital code via row signal paths 44 and column decoder 34 receives some of the bits of the stored digital code via column signal paths 46. Also, row decoder 32 and column decoder 34 receive buffered clock signals via decoder clock signal paths 52. Row decoder 32 decodes the received bits and provides line selection signals and column decoder 34 decodes the received bits and provides column selection signals.

Analog output elements 58 receive line selection signals via line select paths 48, column selection signals via column select paths 50, and buffered clock signals via array clock signal paths 56. Selected analog output elements 58 provide analog signals to summing circuit 40 via element output paths 54. Summing circuit 40 combines the received analog signals to produce the output analog signal OUTA at 26. Non-selected analog output elements 58 do not provide analog signals to summing circuit 40.

In one embodiment, DAC 22 includes analog output elements that are unity coded. In one embodiment, DAC 22 includes analog output elements that are binary-weighted. In one embodiment, DAC 22 is a thermometer coded DAC. In one embodiment, DAC 22 is a binary-weighted DAC. In one embodiment, DAC 22 is segmented. In one embodiment, DAC 22 includes a thermometer-coded DAC section and a binary-weighted DAC section.

Figure 3:
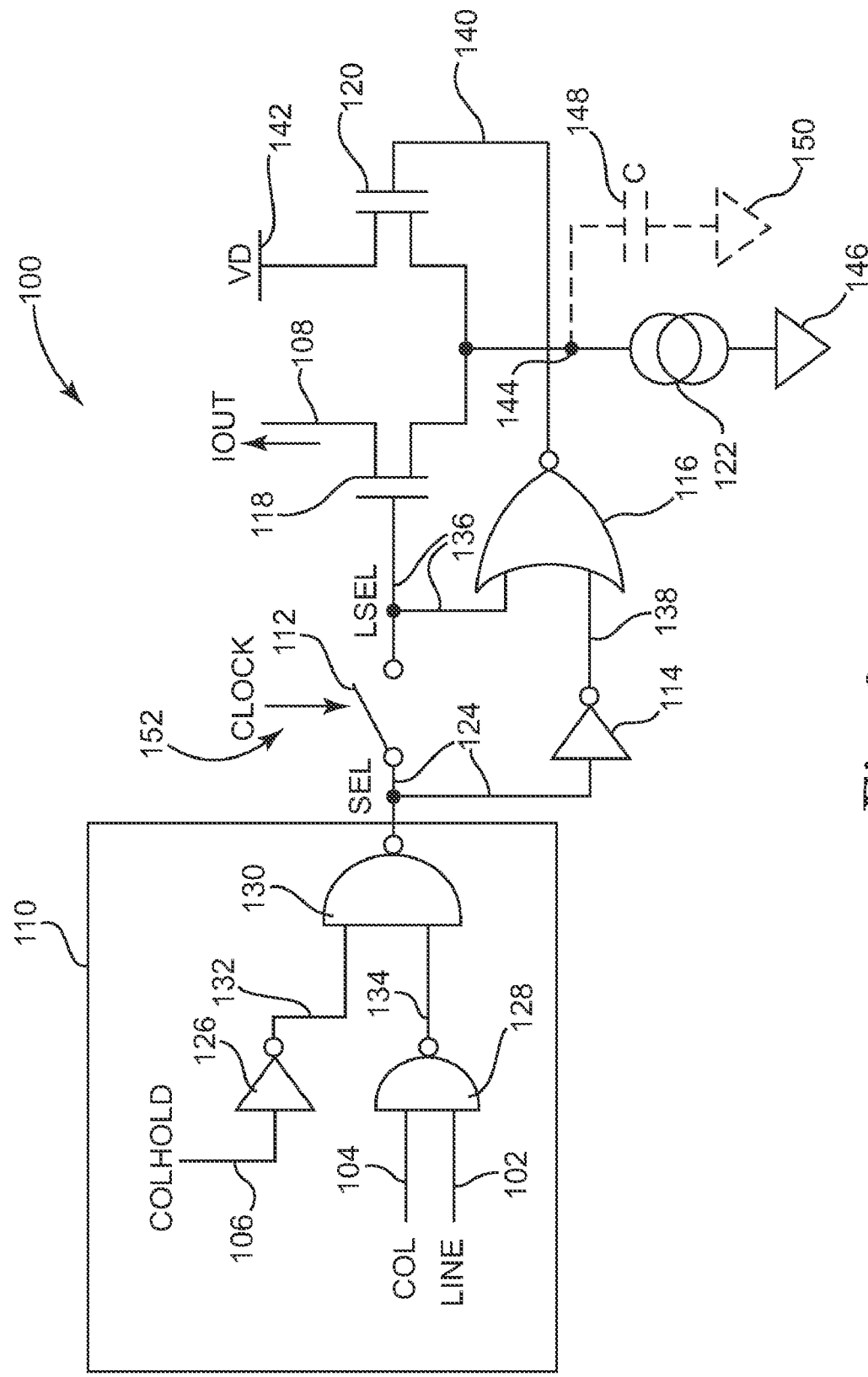
FIG. 3 is a diagram illustrating one embodiment of a current cell.

FIG. 3 is a diagram illustrating one embodiment of a current cell 100 that is an analog output element 58. Current cell 100 receives line selection signal LINE at 102, column selection signal COL at 104, and column hold signal COLHOLD at 106 and provides analog output current IOUT at 108. Current cell 100 includes decoding logic 110, a clocked switch 112, a first inverter 114, a NOR gate 116, a first n-channel metal oxide semiconductor (NMOS) transistor 118, a second NMOS transistor 120, and a current source 122. Decoder logic 110 is electrically coupled to one side of clocked switch 112 and the input of inverter 114 via selection signal path 124.

Decoder logic 110 receives line selection signal LINE at 102, column selection signal COL at 104, and column hold signal COLHOLD at 106 and provides selection signal SEL at 124. Each of the digital codes in the series of input digital codes IND at 24 (shown in FIG. 2) is decoded via row decoder 32 and column decoder 34. Row decoder 32 provides line selection signal LINE at 102 and column decoder 34 provides column selection signal COL at 104. Decoder logic 110 receives selection signal levels for each of the digital codes in the series of input digital codes IND at 24 and decodes the received line selection signal LINE at 102, column selection signal COL at 104, and column hold signal COLHOLD at 106. If all of the current cells 100 in a column are selected via one of the digital codes, column decoder 34 or other column select logic provides a high logic level in column hold signal COLHOLD at 106. Decoder logic 110 provides a high logic level at 124 and current cell 100 is selected if line selection signal LINE at 102 and column selection signal COL at 104 are at high logic levels or if column hold signal COLHOLD at 106 is at a high logic level. Otherwise, decoder logic 110 provides a low logic level at 124 and current cell 100 is non-selected. Decoder logic 110 provides a series of selection bits in selection signal SEL at 124 based on the decoded digital codes in the series of digital input codes IND at 24.

Decoder logic 110 includes a second inverter 126, a first NAND gate 128, and a second NAND gate 130. The output of second inverter 126 is electrically coupled to one input of second NAND gate 130 via signal path 132. The output of first NAND gate 128 is electrically coupled to another input of second NAND gate 130 via signal path 134. The output of second NAND gate 130 is electrically coupled to one side of clocked switch 112 and the input of inverter 114 via selection signal path 124.

First NAND gate 128 receives line selection signal LINE at 102 and column selection signal COL at 104. If both selection signals LINE at 102 and COL at 104 are at a high logic level, first NAND gate 128 provides a low logic level output signal in selection signal SEL at 124. If one or both of the selection signals LINE at 102 and COL at 104 are at a low logic level, first NAND gate 128 provides a high logic level output signal in selection signal SEL at 124. Second inverter 126 receives column hold signal COLHOLD at 106 and provides the inverse of column hold signal COLHOLD at 106 to second NAND gate 130. If both inputs of second NAND gate 130 are at a high logic level, second NAND gate 130 provides a low logic level bit in selection signal SEL at 124. If one or both of the inputs of second NAND gate 130 are at a low logic level, second NAND gate 130 provides a high logic level bit in selection signal SEL at 124. Thus, selection signal SEL at 124 is at a high logic level if line selection signal LINE at 102 and column selection signal COL at 104 are at high logic levels or if column hold signal COLHOLD at 106 is at a high logic level. Otherwise, selection signal SEL at 124 is at a low logic level.

Clocked switch 112 and first inverter 114 receive selection signal SEL at 124. The other side of clocked switch 112 is electrically coupled to the gate of first NMOS transistor 118 and one input of NOR gate 116 via latched selection signal path 136. The output of inverter 114 is electrically coupled to another input of NOR gate 116 via signal path 138. The output of NOR gate 116 is electrically coupled to the gate of second NMOS transistor 120 via signal path 140. One side of the drain-source path of first NMOS transistor 118 provides the analog output current IOUT at 108. One side of the drain-source path of second NMOS transistor 120 is electrically coupled to power supply voltage VD at 142. The other side of the drain-source path of first NMOS transistor 118 is electrically coupled to the other side of the drain-source path of second NMOS transistor 120 and current source 122 via node 144. The other side of current source 122 is electrically coupled to a reference, such as ground, at 146. Also, node 144 includes a parasitic capacitance C at 148 that is electrically couple to a reference, such as ground, at 150.

Clocked switch 112 receives the series of selection bits in selection signal SEL at 124 and clock signal CLOCK at 152. Clocked switch 112 latches in one selection bit at a time from the series of selection bits in selection signal SEL at 124 via clock signal CLOCK at 152 and provides the latched selection bits in latched selection signal LSEL at 136. Clock latched 112 closes to conduct one of the selection bits in selection signal SEL at 124 and opens to latch the selection bit into latched selection signal LSEL at 136. While open, clocked switch 112 receives the next selection bit in the series of selection bits in selection signal SEL at 124.

The gate of first NMOS transistor 118 receives the latched selection bit in latched selection signal LSEL at 136. First NMOS transistor 118 conducts to provide the analog output current IOUT at 108 if the latched selection bit is at a high logic level. Also, NOR gate 116 provides a low logic level and second NMOS transistor 120 is shut off or non-conducting if the latched selection bit is a high logic level. First NMOS transistor 118 is non-conducting to shut off the analog output current IOUT at 108 if the latched selection bit is at a low logic level.

First inverter 114 receives the next selection bit in the series of selection bits in selection signal SEL at 124. NOR gate 116 provides a low logic level and second NMOS transistor 120 is shut off if the next selection bit is a low logic level. NOR gate 116 provides a high logic level and second NMOS transistor 120 conducts if the latched selection bit is a low logic level and the next selection bit is a high logic level. Second NMOS transistor 120 conducts to pre-charge node 144 and capacitor 148. This occurs if first NMOS transistor 118 is non-conducting, but set to conduct in response to the next selection bit.

In operation, each of the digital codes in the series of input digital codes IND at 24 is decoded via row decoder 32, which provides line selection signal LINE at 102, and column decoder 34, which provides column selection signal COL at 104. If all of the current cells 100 in a column are selected via one of the digital codes, column decoder 34 or other column select logic provides a high logic level in column hold signal COLHOLD at 106. Decoder logic 110 provides a high logic level at 124 and current cell 100 is selected if line selection signal LINE at 102 and column selection signal COL at 104 are at high logic levels or if column hold signal COLHOLD at 106 is at a high logic level. Decoder logic 110 provides the series of selection bits in selection signal SEL at 124 based on the decoded digital codes in the series of digital input codes IND at 24.

Clocked switch 112 receives the series of selection bits in selection signal SEL at 124 and latches in one selection bit at a time from the series of selection bits in selection signal SEL at 124 via clock signal CLOCK at 152. Clock latched 112 closes to conduct one of the selection bits in selection signal SEL at 124 and opens to latch the selection bit into latched selection signal LSEL at 136. Clocked switch 112 provides the latched selection bit in latched selection signal LSEL at 136 to the gate of first NMOS transistor 118 and NOR gate 116. After opening, clocked switch 112 receives the next selection bit in the series of selection bits in selection signal SEL at 124.

If the latched selection bit is at a high logic level, current cell 100 is selected and first NMOS transistor 118 conducts to provide analog output current IOUT at 108. Also, second NMOS transistor 120 is shut off to be non-conducting.

If the latched selection bit is at a low logic level, current cell 100 is non-selected and first NMOS transistor 118 is non-conducting to shut off analog output current IOUT at 108. Also, if the next selection bit is at a high logic level and the latched selection bit is at a low logic level, NOR gate 116 provides a high logic level and second NMOS transistor 120 conducts to pre-charge node 144 and capacitor 148. If the next selection bit is at a low logic level, NOR gate 116 provides a low logic level and second NMOS transistor 120 is shut off to be non-conducting.

Controlling analog output current IOUT at 108 via a single-ended switch, such as first NMOS transistor 118, reduces power consumption. Pre-charging node 144 and capacitor 148 in a non-selected current cell 100 that is to be selected via the next selection bit that corresponds to the next digital code in the series of input digital codes IND at 24 reduces glitches in the analog output current IOUT at 108 and improves performance.

FIG. 4 is a logic table illustrating the operation of current cell 100 of FIG. 3. The logic table includes the logic levels of selection signal SEL at 200 and latched selection signal LSEL at 202. If analog output current IOUT at 204 is provided at the output of current cell 100, the logic level is a high or 1, and if analog output current IOUT at 204 is shut off, the logic level is a low or 0. If second NMOS transistor 120 pre-charges node 144, PRE-CHARGE at 206 is a high logic level of 1, and if second NMOS transistor 120 is not pre-charging node 144, PRE-CHARGE at 206 is a low logic level of 0.

In the first row at 208, selection signal SEL at 200 and latched selection signal LSEL at 202 are at low logic levels. The low logic level of selection signal SEL at 200 prevents pre-charging of node 144 via second NMOS transistor 120 and PRE-CHARGE at 206 is a low logic level. The low logic level of latched selection signal LSEL at 202 shuts off the analog output current IOUT at 204, indicated by the low logic level.

In the second row at 210, selection signal SEL at 200 is at a low logic level and latched selection signal LSEL at 202 is at a high logic level. The low logic level of selection signal SEL at 200 prevents pre-charging of node 144 via second NMOS transistor 120 and PRE-CHARGE at 206 is a low logic level. First NMOS transistor conducts in response to the high logic level of latched selection signal LSEL at 202 and analog output current IOUT at 204 is provided at the output of current cell 100, as indicated by a high logic level.

In the third row at 212, selection signal SEL at 200 is at a high logic level and latched selection signal LSEL at 202 is at a low logic level. The low logic level of latched selection signal LSEL at 202 shuts off the analog output current IOUT at 204, as indicated by the low logic level. Second NMOS transistor 120 is turned on via the high logic level of selection signal SEL at 200 and the low logic level of latched selection signal LSEL at 202. Second NMOS transistor 120 conducts to pre-charge node 144 and PRE-CHARGE at 206 is a high logic level.

In the fourth row at 214, selection signal SEL at 200 and latched selection signal LSEL at 202 are at high logic levels. First NMOS transistor conducts in response to the high logic level of latched selection signal LSEL at 202 and analog output current IOUT at 204 is provided at the output of current cell 100, as indicated by a high logic level. Also, the high logic level of latched selection signal LSEL at 202 shuts off pre-charging of node 144 via second NMOS transistor 120 and PRE-CHARGE at 206 is at a low logic level.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
a first switch configured to latch a bit in a series of bits to provide a latched bit;
a second switch configured to conduct based on the latched bit; and
a third switch configured to conduct based on the latched bit and a next bit in the series of bits, wherein the next bit follows the latched bit in the series of bits.

2. The semiconductor device of claim 1, wherein the second switch conducts between a node and an output and the node is pre-charged via the third switch.

3. The semiconductor device of claim 2, comprising:
a current source configured to provide a current, wherein the second switch conducts the current between the node and the output.

4. The semiconductor device of claim 1, wherein the third switch is configured to conduct if the second switch is non-conducting and the next bit has a different logic value than the latched bit.

5. The semiconductor device of claim 1, wherein the third switch is non-conducting if the next bit has the same logic value as the latched bit.

6. The semiconductor device of claim 1, wherein the third switch is non-conducting if the second switch conducts and the next bit has a different logic value than the latched bit.

7. The semiconductor device of claim 1, wherein the first switch is configured to latch the bit based on a clock signal.

8. The semiconductor device of claim 1, comprising:
logic configured to decode line selection signals and column selection signals and provide the series of bits.

9. A digital to analog converter comprising:
a register configured to receive a series of digital codes;
an array of current cells including current cells selected via digital codes in the series of digital codes, wherein each of the current cells in the array of current cells comprises:
a first switch configured to conduct a current between a node and an output in a selected current cell and to be non-conducting in a non-selected current cell; and
a second switch configured to conduct and pre-charge the node in the non-selected current cell if the next digital code in the series of digital codes selects the non-selected current cell.

10. The digital to analog converter of claim 9, wherein each of the current cells comprises:
a third switch configured to latch a selection bit and provide a latched selection bit.

11. The digital to analog converter of claim 10, wherein the first switch is configured to be controlled via the latched selection bit.

12. The digital to analog converter of claim 10, wherein the second switch is configured to be controlled via the latched selection bit and next selection bit.

13. The digital to analog converter of claim 9, wherein each of the current cells comprises:
a current source configured to provide the current that the first switch conducts between the node and the output.

14. The digital to analog converter of claim 9, comprising:
a line decoder; and
a column decoder, wherein the line decoder and the column decoder decode each of the digital codes received by the register and provide line selection signals and column selection signals.

15. The digital to analog converter of claim 14, wherein each of the current cells comprises:
logic configured to decode the line selection signals and the column selection signals and provide selection bits.

16. The digital to analog converter of claim 9, wherein the digital to analog converter is a binary weighted digital to analog converter.

17. The digital to analog converter of claim 9, wherein the digital to analog converter is a thermometer coded digital to analog converter.

18. The digital to analog converter of claim 9, wherein the digital to analog converter is segmented to be a thermometer coded and binary weighted digital to analog converter.

19. A method of operating a semiconductor device comprising:
latching a bit in a series of bits to provide a latched bit;
controlling a first switch via the latched bit; and
controlling a second switch via the latched bit and next bit that follows the latched bit in the series of bits.

20. The method of claim 19, wherein:
controlling a first switch comprises:
conducting current between a node and an output via the first switch; and
controlling a second switch comprises:
pre-charging the node via the second switch based on the latched bit and next bit.

21. The method of claim 20, wherein pre-charging the node comprises:
pre-charging the node if the first switch is non-conducting and the next bit has a different logic value than the latched bit.

22. The method of claim 19, wherein controlling a second switch comprises:
controlling the second switch to be non-conducting if the next bit has the same logic value as the latched bit.

23. The method of claim 19, wherein controlling a second switch comprises:
controlling the second switch to be non-conducting if the second switch conducts and the next bit has a different logic value than the latched bit.

24. A method of operating a digital to analog converter comprising:
receiving a series of digital codes;
selecting current cells based on digital codes in the series of digital codes;
controlling a first switch to conduct a current between a node and an output in a selected current cell;
controlling the first switch to be non-conducting in a non-selected current cell;
controlling a second switch to conduct and pre-charge the node in the non-selected current cell if the next digital code in the series of digital codes selects the non-selected current cell.

25. The method of claim 24, comprising:
decoding each digital code in the series of digital codes;
providing a series of line selection signals based on the series of digital codes;
providing a series of column selection signals based on the series of digital codes;

decoding the series of line selection signals and the series of column selection signals;
providing a series of selection bits;
latching one of the series of selection bits and providing a latched selection bit;
controlling the first switch via the latched selection bit; and
controlling the second switch via the latched selection bit and next selection bit in the series of selection bits.

* * * * *